(12) United States Patent
Gardner et al.

(10) Patent No.: US 10,966,339 B1
(45) Date of Patent: Mar. 30, 2021

(54) STORAGE SYSTEM WITH REMOVABLE SOLID STATE STORAGE DEVICES MOUNTED ON CARRIER CIRCUIT BOARDS

(75) Inventors: Brock R. Gardner, Seattle, WA (US); Michael P. Czamara, Seattle, WA (US)

(73) Assignee: Amazon Technologies, Inc., Seattle, WA (US)

(*) Notice: Subject to any disclaimer, the term of this patent is extended or adjusted under 35 U.S.C. 154(b) by 965 days.

(21) Appl. No.: 13/171,235

(22) Filed: Jun. 28, 2011

(51) Int. Cl.
*H05K 7/14* (2006.01)
*G06F 11/07* (2006.01)
*H05K 7/02* (2006.01)

(52) U.S. Cl.
CPC ....... *H05K 7/1489* (2013.01); *G06F 11/0766* (2013.01); *H05K 7/023* (2013.01); *H05K 7/1422* (2013.01); *H05K 7/1427* (2013.01); *H05K 7/1454* (2013.01); *H05K 7/1487* (2013.01); *H05K 7/1488* (2013.01)

(58) Field of Classification Search
CPC .. G06F 12/0246; G06F 3/0679; G06F 3/0607; G06F 3/0688; G06F 2212/2022; H05K 7/1489; H05K 7/183; H05K 7/18; H05K 7/1491; H05K 5/0021; H05K 5/0217; H05K 5/0221; H05K 7/02; H05K 7/20709; H05K 13/00; H05K 13/0486; H05K 3/325; H05K 5/0226; H05K 5/0256; H05K 7/14; H05K 7/1401; H05K 7/1405; H05K 7/1411; H05K 7/1421; H05K 7/1487; H05K 7/1488; H05K 7/1492; H05K 7/20145; H05K 7/2039; H05K 7/20418; H05K 7/20545; H05K 7/20736; H05K 7/20754; H05K 7/20781
See application file for complete search history.

(56) References Cited

U.S. PATENT DOCUMENTS

| | | | | |
|---|---|---|---|---|
| 5,961,346 | A | * 10/1999 | Choy | .............................. 439/567 |
| 6,098,128 | A | * 8/2000 | Velez-McCaskey et al. | .. 710/65 |
| 7,458,842 | B1 | * 12/2008 | Gange | .............. H01R 13/62988 |
| | | | | 439/160 |
| 7,660,911 | B2 | 2/2010 | Mcdaniel | |
| 9,250,687 | B1 | * 2/2016 | Aswadhati | ............. G06F 1/3225 |
| 2002/0095543 | A1 | * 7/2002 | Shioda | ............. G11B 20/10527 |
| | | | | 711/1 |
| 2003/0011391 | A1 | * 1/2003 | Brunelle | ............ G01R 31/2886 |
| | | | | 324/756.02 |
| 2004/0058577 | A1 | * 3/2004 | Ku | ................................ 439/328 |
| 2004/0152352 | A1 | * 8/2004 | Tsai | ............................... 439/326 |
| 2004/0267975 | A1 | * 12/2004 | Hsu et al. | ........................ 710/9 |

(Continued)

FOREIGN PATENT DOCUMENTS

WO 2010117928 A1 10/2010

*Primary Examiner* — Reginald G Bragdon
*Assistant Examiner* — Thanh D Vo
(74) *Attorney, Agent, or Firm* — Robert C. Kowert; Kowert, Hood, Munyon, Rankin & Goetzel, P.C.

(57) ABSTRACT

A data storage module includes one or more carrier circuit board assemblies mounted in a rack. An array of removable solid state data storage devices (such as USB thumb drives or SD cards) is coupled to the circuit board assemblies. A data storage controller is coupled to the solid state data storage devices in the array. The data storage controller stripes data across at least two of the solid state data storage devices.

24 Claims, 7 Drawing Sheets

(56) References Cited

U.S. PATENT DOCUMENTS

| | | | |
|---|---|---|---|
| 2005/0015430 A1* | 1/2005 | Rothman | G06F 9/5011 |
| | | | 709/201 |
| 2005/0105346 A1* | 5/2005 | Shih | 365/200 |
| 2006/0063400 A1* | 3/2006 | Tsai | H01R 31/06 |
| | | | 439/74 |
| 2008/0140724 A1* | 6/2008 | Flynn | G06F 1/183 |
| 2009/0077293 A1* | 3/2009 | Kerrigan | H05K 7/1409 |
| | | | 710/301 |
| 2009/0257185 A1* | 10/2009 | Signer et al. | 361/679.32 |
| 2009/0308930 A1* | 12/2009 | Poguntke | G06K 7/0021 |
| | | | 235/486 |
| 2010/0027220 A1* | 2/2010 | Hughes et al. | 361/702 |
| 2010/0282932 A1* | 11/2010 | Ong | H05K 7/1489 |
| | | | 248/206.5 |
| 2011/0035540 A1* | 2/2011 | Fitzgerald et al. | 711/103 |

* cited by examiner

STORAGE SYSTEM WITH REMOVABLE SOLID STATE STORAGE DEVICES MOUNTED ON CARRIER CIRCUIT BOARDS

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack system. Some known rack systems include 40 such rack-mounted components and such rack systems will therefore generate as much as 10 kilowatts of waste heat. Moreover, some known data centers include a plurality of such rack systems.

Some servers include a number of hard disk drives (for example, eight or more hard disk drives) to provide adequate data storage. Typically, the hard disk drives for servers are of a standard, off-the-shelf type. Standard, off-the-shelf hard disk drives are often a cost effective solution for storage needs because such hard disk drives can be obtained at relatively low cost. Nonetheless, in server designs using such standard hard disk drives, the arrangement of the hard disk drives may leave a substantial amount of wasted space in the server chassis. This wasted space, especially when multiplied over many servers in a rack, may result in inadequate computing or storage capacity for a system.

Hard disk drives include motors and electronic components that generate heat. Some or all of this heat must be removed from the hard disk drives to maintain continuous operation of a server. The amount of heat generated by the hard disk drives within a data room may be substantial, especially if all of the hard disk drives are fully powered up at all times.

As with other components, hard disk drives fail from time to time while in service. These failures reduce the storage capacity of a system. To restore capacity, servers may need to be powered down and removed from a rack so that the defective hard disk drives can be replaced or repaired. In some cases, a server may need to be taken down when only a relatively small number of sectors of the hard disk drives are bad. For example, in a server having a total of ten hard disk drives, if two sectors on each of two of the ten hard disk drives are bad, the server may need to be taken off-line and repaired.

In some systems, such as archival, backup, or disaster recovery systems, a vast amount of may need to be stored, though any particular piece of the stored data may be accessed only rarely. Magnetic tape systems are often used to store archival data. Magnetic tape drives, however, may be fragile and susceptible to adverse environmental conditions, such as heat and humidity. In addition, some magnetic tape drives have relatively high failure rates.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of data storage modules, and systems and methods for storage data, are disclosed. According to one embodiment, a data storage module includes one or more carrier circuit board assemblies mounted in a rack. An array of removable solid state data storage devices (such as USB thumb drives or SD cards) is coupled to the circuit board assemblies. A data storage controller is coupled to the solid state data storage devices in the array. The data storage controller stripes data across the solid state data storage devices.

According to one embodiment, a data storage system includes one or more circuit board assemblies and an array of removable solid state data storage devices coupled to the circuit board assemblies. A data storage controller is coupled to the solid state data storage devices in the array. The data storage controller stripes data across the solid state data storage devices.

According to one embodiment, a method of providing data storage includes providing, in a rack, an array of removable solid state data storage devices on one or more circuit board assemblies. Data is striped across the solid state data storage devices in the array.

According to one embodiment, a data storage system includes two or more data storage devices, a carrier that supports the data storage devices, and a fault detection system that can detect faults in particular data storage devices. Upon detection of a fault is detected a particular one of the data storage devices, the carrier indicates a physical location of the faulty data storage device.

As used herein, "solid state storage device" means a device that includes solid state memory that can be used to store data. Examples of solid-state storage devices include flash drives, USB thumb drives, SD cards, micro SD cards, Memory Stick, SmartMedia, CompactFlash, and MultiMediaCard (MMC).

As used herein, "solid state memory" includes memory that does not have moving parts. Examples of solid-state memory include electrically erasable programmable read-only memory (EEPROM), dynamic random-access memory (DRAM), and flash memory. Flash memory may include, for example, NAND flash and NOR flash.

As used herein, "data striping" includes storing segments of sequential data on multiple physical storage devices.

As used herein, "commodity device" means a device of a type that is available from two or more different suppliers, in which the devices available from the different suppliers are interchangeable with one another. A commodity device may be, for example, a USB thumb drive.

As used herein, "backplane" means a plate or board to which other electronic components, such as mass storage devices, circuit boards, can be mounted. In some embodiments, hard disk drives are plugged into a backplane in a generally perpendicular orientation relative to the face of the backplane. In some embodiments, a backplane includes and one or more power buses that can transmit power to components on the backplane, and one or more data buses that can transmit data to and from components installed on the backplane.

As used herein, a "cable" includes any cable, conduit, or line that carries one or more conductors and that is flexible over at least a portion of its length. A cable may include a connector portion, such as a plug, at one or more of its ends.

As used herein, "circuit board" means any board or plate that has one or more electrical conductors transmitting power, data, or signals from components on or coupled to the circuit board to other components on the board or to external components. In certain embodiments, a circuit board is an epoxy glass board with one or more conductive layers therein. A circuit board may, however, be made of any suitable combination of materials.

As used herein, "chassis" means a structure or element that supports another element or to which other elements can be mounted. A chassis may have any shape or construction, including a frame, a sheet, a plate, a box, a channel, or a combination thereof. In one embodiment, a chassis is made from one or more sheet metal parts. A chassis for a computer system may support circuit board assemblies, power supply units, data storage devices, fans, cables, and other components of the computer system.

As used herein, "computing" includes any operations that can be performed by a computer, such as computation, data storage, data retrieval, or communications.

As used herein, "computing device" includes any of various devices in which computing operations can be carried out, such as computer systems or components thereof. One example of a computing device is a rack-mounted server. As used herein, the term computing device is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. Some examples of computing devices include e-commerce servers, network devices, telecommunications equipment, medical equipment, electrical power management and control devices, and professional audio equipment (digital, analog, or combinations thereof). In various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers dedicated to specific functions or serving multiple functions. Examples of computer operations include information processing, communications, testing, simulations, power distribution and control, and operational control.

As used herein, "data center module" means a module that includes, or is suitable for housing and/or physically supporting, one or more computer systems that can provide computing resources for a data center.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, "primarily horizontal" means more horizontal than vertical. In the context of an installed element or device, "primarily horizontal" includes an element or device whose orientation as installed results in the element or device having a height less than its largest horizontal dimension.

As used herein, "primarily vertical" means more vertical than horizontal. In the context of an installed element or device, "primarily vertical" includes an element or device whose orientation as installed results in the element or device having a height greater than its largest horizontal dimension.

As used herein, a "rack" means a rack, container, frame, shelf, or other element or combination of elements that can contain or physically support one or more computer systems.

As used herein, "room" means one or more rooms or spaces of a building. As used herein, "computer room" means a room of a building in which computer systems, such as rack-mounted servers, are operated.

As used herein, a "space" means a space, area or volume.

As used herein, "shelf" means any element or combination of elements on which an object can be rested. A shelf may include, for example, a plate, a sheet, a tray, a disc, a block, a grid, or a box. A shelf may be rectangular, square, round, or another shape. In some embodiments, a shelf may be one or more rails.

Figure 1A:
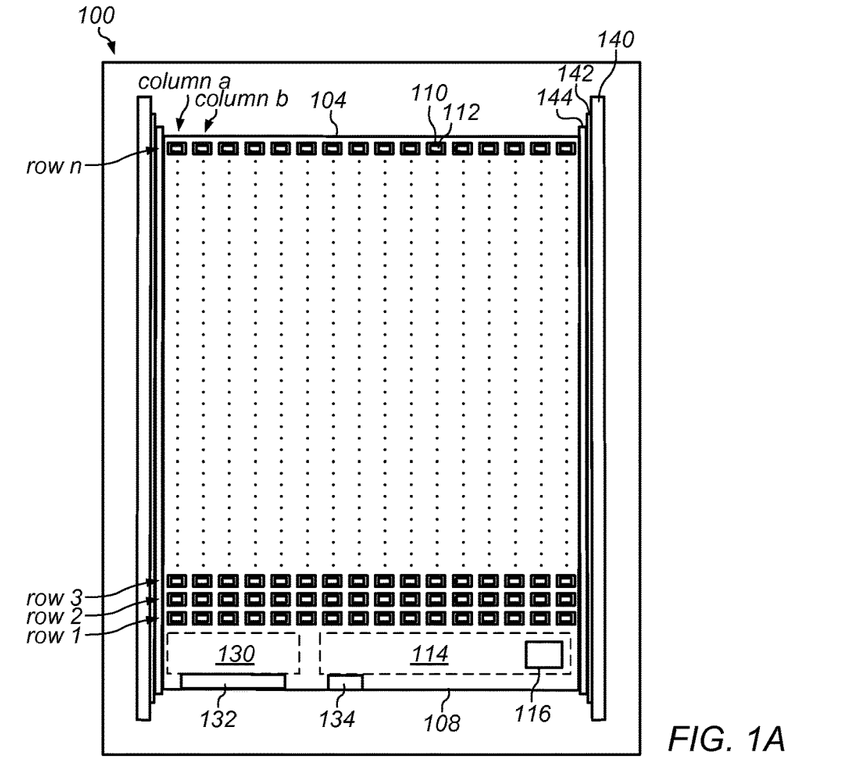
FIG. 1A is a top view illustrating one embodiment of a rack-mounted including a data storage module with removable data storage devices.
Figure 1B:
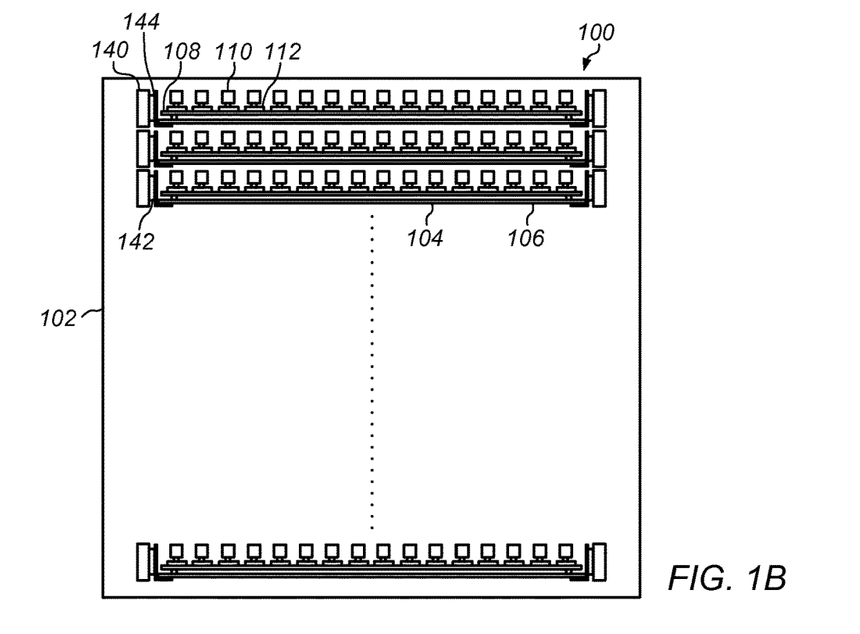
FIG. 1B is a front view illustrating one embodiment of a system including a rack-mounted data storage module with removable data storage devices and a controller.

In some embodiments, a data storage module includes an array of removable solid state storage devices and a data storage controller that can stripe data across the solid state storage devices. The solid state data storage devices may be, for example, USB thumb drives or SD cards. The array of removable solid state storage devices may be held on a circuit board. FIG. 1A is a top view illustrating one embodiment of a rack-mounted including a data storage module with removable data storage devices. FIG. 1B is a front view illustrating one embodiment of a system including a rack-mounted data storage module with removable data storage devices and a controller. System 100 includes rack 102 and data storage module 104. Data storage module 104 includes tray 106, circuit board 108, and solid state data storage devices 110.

Solid state data storage devices 110 are held in sockets 112 on carrier circuit board 108. Solid state data storage devices 110 may be hand-removable from sockets 112, with or without tools.

In some embodiments, the memory devices include a case that encloses the circuitry of the solid state data storage device except for electrical contacts to connect the device to a controller. In various embodiments, solid state data storage devices 110 may be off-the-shelf devices, such as SD cards, micro SD cards, or CompactFlash devices. In various embodiments, solid state data storage devices 110 may be commodity devices. In one embodiment, solid state data storage devices 110 are USB thumb drives. In certain embodiments, a carrier board may accommodate solid state data storage devices of two or more different types (for example, having some slots for USB thumb drives and other slots for SD cards). In certain embodiments, solid state storage devices include one or more SD cards installed in memory card readers.

Solid state storage devices 110 are arranged in rows and columns across the surface of circuit board 108. Rows of solid state storage devices 110 may be provided near the front of data storage module 104 (rows 1, 2, and 3) and continue to the rear end of data storage module 104 (row n) (rows between row 3 and row n are represented as dots for clarity). Each of the columns of solid state storage devices 110 (for example, column A, column B) extend from near the front end of data storage module 104 to the rear of data storage module 104.

For illustrative purposes, in the embodiment shown in FIG. 1, each row of solid state storage devices 110 includes 16 devices. A data storage module may, however, include an array of any number of row and columns. In some embodiments, solid state storage devices may be placed in other patterns or layouts (for example, diagonal rows, a radial pattern, or an irregular layout).

Solid state data storage devices 110 may be of any capacity. In one embodiment, each of solid state data storage devices 110 has a capacity of about 32 gigabytes. In another embodiment, each of solid state data storage devices 110 has a capacity of about 128 gigabytes.

Circuit board 108 includes data controller 114. Controller 114 includes microprocessor 116. Controller 114 may be electrically coupled to each of solid state data storage devices 110. Solid state storage devices are coupled to controller 114. Controller 114 may access data on any or all of solid state storage devices 110 in data storage modules 104.

Controller 114 may be of various types, including micro controller, field programmable gate array (FPGA), or digital signal processor (DSP). In one embodiment, data controller 114 is a multichannel solid state microcontroller.

Controller 114 may control any number of memory chips on one or more solid state data storage devices. Memory chips may be, for example, non-volatile NAND flash memory chips. In some embodiments, data is accessed in blocks. For example, data may be managed in blocks of 512 bytes. Any of various algorithms may be used to map data to physical locations. In one embodiment, each channel of a multichannel solid state microcontroller corresponds to a different solid state data storage device. In one embodiment, each channel of a multi-channel solid state microcontroller controls a different set of solid state data storage devices (for example, each channel controls a row of USB thumb devices.)

In some embodiments, controller 114 can stripe data across solid state storage devices 110. Controller 114 may implement various data striping techniques. Segments of data may be accessed from the data storage devices concurrently, sequentially, or a combination thereof. Data striping may be, in various embodiments, carried out at a byte-level or a block level.

In some embodiments, data striping is carried out in a multi-channel data storage system. Multiple solid state data storage devices may be coupled to each of the channels. In one embodiment, each channel corresponds to one or more rows or columns of storage devices in an array. For example, row 1 of solid state data storage devices may correspond to a first channel of controller 114, row 2 of solid state data storage devices may correspond to a second channel of controller 114, and so on.

In certain embodiments, data striping includes redundant storage. In certain embodiments, multiple storage devices are implemented as Redundant Array of Inexpensive Disks (RAID). Examples of RAID levels that may be used include RAID 0, RAID 4, RAID 5, or RAID 10.

In some embodiments, data striping includes narrow striping, for example, across the drives in one array. In some embodiments, data striping may include wide striping, for example, across multiple arrays of drives.

In various embodiments, data access and transfer between a data controller and data storage modules in a system may be carried out by way of any suitable computer bus or combination of buses. In various embodiments, suitable buses may include Universal Serial Bus (USB), Serial attached SCSI (SAS) bus, IEEE 1394 (firewire), Advance Technology Attachment (ATA), Serial Advance Technology Attachment (SATA), or SD bus.

In some embodiments, a controller includes one or more adapters or bridges. The adapters or bridges may allow data exchange between buses of different types. For example, a controller may include a bridge between a Serial Advance Technology Attachment (SATA) bus and a Universal Serial Bus (USB).

Circuit board 108 includes network interface module 130 and data connector 132. Network interface module 130 allows for exchange of data between data storage module 104 and external systems over a network. Data connector 132 may be connected to external components by way of one or more data cables (data cables not shown in FIG. 1 for clarity). In one embodiment, network interface module 130 is an Ethernet card. In another embodiment, network interface module 130 provides for a fiber optic transmission of data.

In certain embodiments, messages may be sent from data storage module 104 using Simple Network Management Protocol (SNMP) data (for example, an SNMP trap). Any network protocol, however, may be used in various embodiments to send data from, or receive data into, data storage module 104.

Circuit board 108 may include circuitry for providing electrical power to solid state data storage devices 110, controller 114, and network interface module 130. Power connector 134 may be connected to an external power supply by way of one or more power cables (power cables are not shown in FIG. 1 for clarity).

Data storage module 104 is rack-mounted in rack 102. Rack 104 includes rails 140. Rails 140 may be mounted in rack, for example, on vertical posts near the front and rear of the rack (such posts are not shown in FIG. 1 for clarity.) Slides 142 are coupled to rails 140.

Guides 144 are attached to opposing sides of tray 106. Guides 144 may engage on slides 142. To remove data storage module 104 from rack 102 or to gain access to solid state storage devices 110, tray 106 may be pulled out from the fully installed position in rack 102. Slides 142 may extend out of rack 104 to support data storage module 104 in a partially withdrawn position.

In the embodiment shown in FIG. 1, data storage modules 104 are installed in slots in rack 102. System 100 may include any number of data storage modules within the capacity of rack 102. In some embodiments, each data storage module is about 1 U in height.

System 100 includes buses on circuit boards 108. Each of the buses may provide a connection for data input/output between controller 104 and one or more of solid state data storage devices 110. In some embodiments, each of buses 150 provide for data I/O on multiple channels (for example, four channels).

In the embodiment shown in FIG. 1, data storage module 104 includes a single circuit board, and all of the data storage devices are installed on the circuit board, in a single tier. In various embodiments, however, a data storage module may have any number of circuit boards, with any number of tiers and arrangements of the circuit boards and data storage devices. For example, in some embodiments, a data storage module includes a single tray that supports two or more circuit boards in a tiered arrangement. As another example, a tray may support multiple circuit boards arranged in a co-planar arrangement (for example, tiled across the width and depth of the module).

Figure 2A:
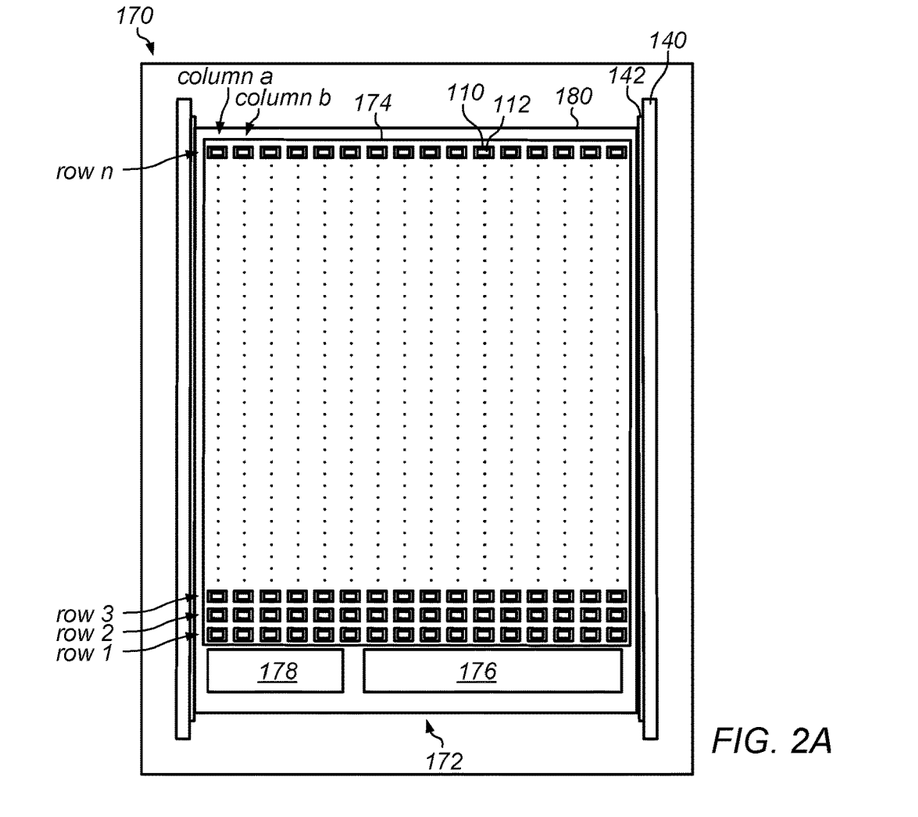
FIG. 2A is a top view illustrating one embodiment of a data storage module including tiers of solid state data storage devices with separate controller and power supply unit.
Figure 2B:
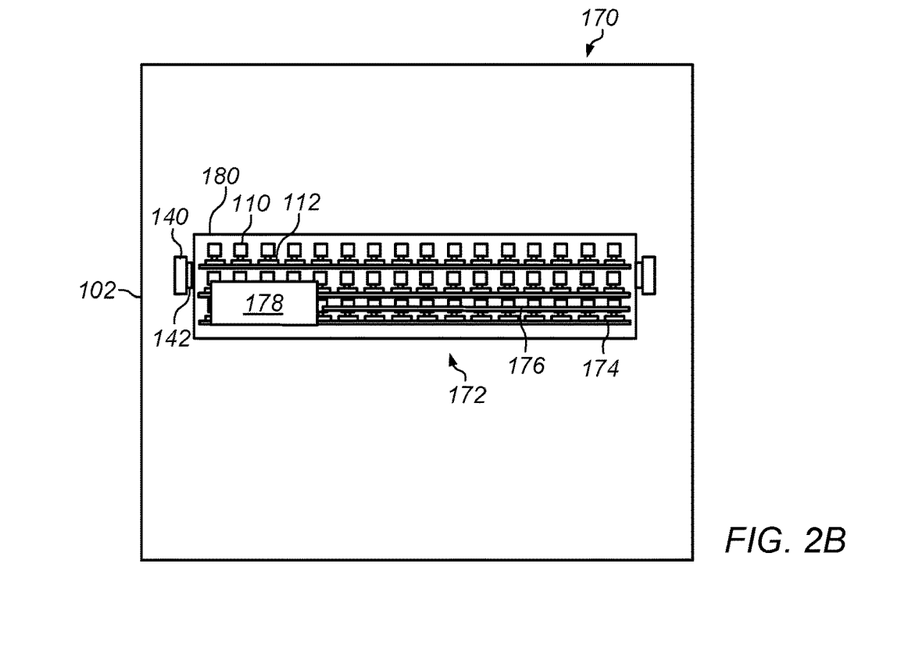
FIG. 2B is a front view illustrating one embodiment of a data storage module including tiers of solid state data storage devices with separate controller and power supply unit.

FIG. 2A illustrates a top view of a data storage module including tiers of solid state data storage devices with separate controller and power supply unit. FIG. 2B illustrates a front view of a data storage module including tiers of solid state data storage devices with separate controller and power supply unit. System 170 includes rack 102 and one or more data storage modules 172. Data storage module 172 includes backplane circuit boards 174, controller circuit board 176, power supply 178, and chassis 180. Backplane circuit boards 174 include sockets 112. Backplane circuit boards 174 each hold an array of solid state data storage devices 110. Chassis 180 encloses and supports backplane circuit boards 174, solid state data storage devices 110, controller circuit board 176, and power supply 178. Controller 176 is coupled to, and configured to access data on, solid state data storage devices 110. Power supply 178 is coupled to, and supplies power to controller 176 and solid state data storage devices 110 via backplane circuit boards 174.

Figure 3:
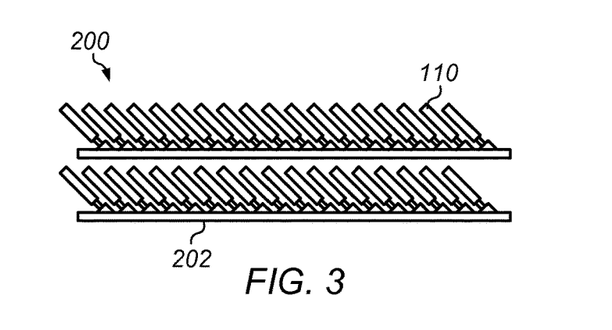
FIG. 3 illustrates one embodiment of data storage module with solid state drives mounted at a slant relative to a backplane.

In some embodiments, solid state storage devices are mounted at a slant with respect to a backplane. FIG. 3 illustrates one embodiment of data storage module with solid state drives mounted at a slant relative to a backplane. Data storage module 200 includes backplane 202 and solid state data storage devices 110. Solid state storage devices 110 are mounted on a slant relative to backplane 202. In the embodiment shown in FIG. 3, solid state data storage devices 110 are mounted at a 45 degree angle relative to backplane 202. Solid state data storage devices 110 may, however, be mounted in various embodiments at any angle between vertical and horizontal (for example, between 0 degrees and 90 degrees). Data may be striped across solid state storage devices 110, for example, in the manner described above relative to FIG. 1.

Figure 4:
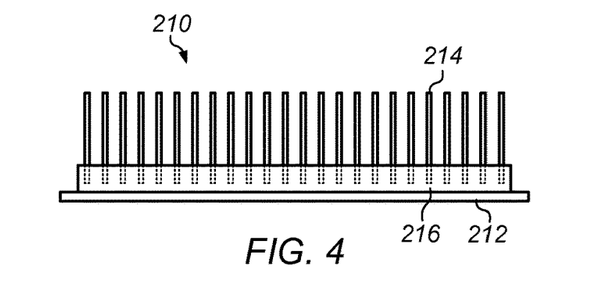
FIG. 4 illustrates an embodiment of a data storage module that includes solid state memory cards installed vertically in a backplane.

FIG. 4 illustrates an embodiment of a data storage module that includes solid state memory cards installed vertically in a backplane. Data storage module 210 includes backplane 212 and solid state data storage devices 214. Solid state data storage cards 214 may be, for example, SD cards.

Figure 5A:
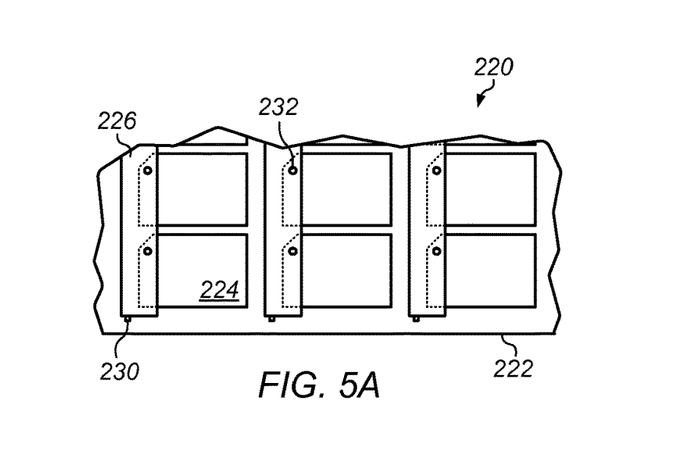
FIG. 5A is a top view illustrating one embodiment of a data storage module having data storage devices in a primarily horizontal orientation.
Figure 5B:
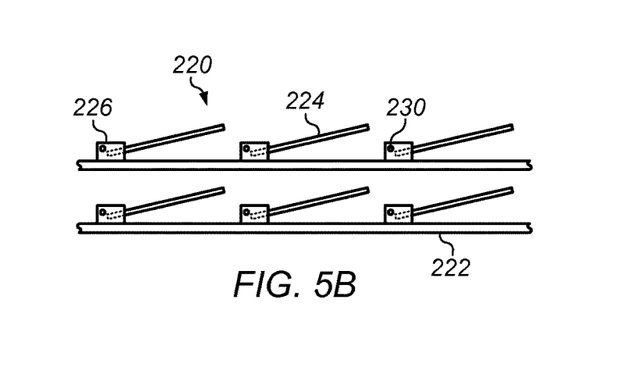
FIG. 5B is a front view illustrating one embodiment of data storage modules having data storage devices in a primarily horizontal orientation.

FIG. 5A is a top view illustrating one embodiment of a data storage module having data storage devices in a primarily horizontal orientation. FIG. 5B is a front view illustrating one embodiment of data storage modules having data storage devices in a primarily horizontal orientation. Data storage modules 220 include carriers 222. Solid state data storage devices 224 may be installed in sockets 226 of carriers 222. Carriers 222 may be, for example, circuit board assemblies. Carriers 22 may mounted in rack, similar to those shown in FIG. 1B. Carriers 222 may slide out of a rack to allow access to solid state data storage devices 224 installed in sockets 226. Solid state data storage devices 224 may be, for example, SD cards. Carriers 222 may include indicator lights 230 and 232. Indicator lights 230 may indicate status one or more storage devices in a row of storage devices (for example, a light may indicate that one or more of the solid state storage devices on that socket is faulty or that one or more solid state storage devices on that socket are not fully installed. In one embodiment, indicator lights 230 are at the front of rack-mounted module such that maintenance personnel can assess status from the front panel of the module. Indicator lights 232 may indicate status of particular solid state storage devices 224 on carriers 222. For example, each of indicator lights 232 may indicate that the solid state storage device has power, or that the solid state storage device is fully installed in socket 226. In certain embodiments, an indicator light indicates that a solid state storage device is faulty.

Figure 6A:
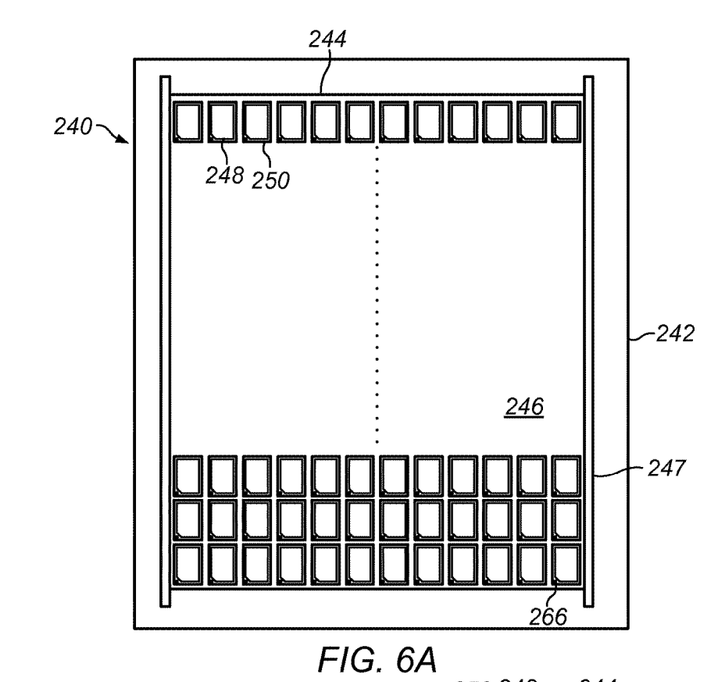
FIG. 6A is a top view illustrating one embodiment of a system including solid state data storage cards mounted horizontally in a data storage module.
Figure 6B:
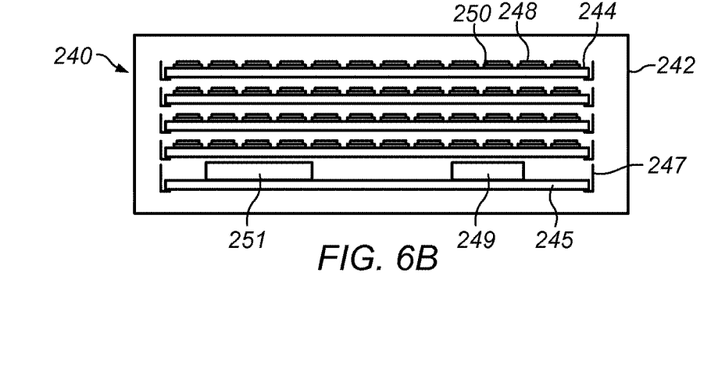
FIG. 6B is a front view illustrating one embodiment of a system including solid state data storage cards mounted horizontally in a data storage module.

In some embodiments, solid state data storage devices are mounted horizontally on a circuit board. FIG. 6A is a top view illustrating one embodiment of a system including solid state data storage cards mounted horizontally in a data storage module. FIG. 6B is a front view illustrating one embodiment of a system including solid state data storage cards mounted horizontally in a data storage module. System 240 includes rack 242, data storage modules 244, and data storage controller 245. Data storage modules 244 include circuit board 246 and solid state data storage cards 248. Solid state data storage cards 248 may be, for example, SD cards.

Data storage modules 244 and data storage controller 245 may be mounted on rails 247 of rack 242. In certain embodiments, data storage modules 244 and data storage controller 245 are mounted on slides, in a manner similar to that described above relative to FIGS. 1A and 1B. In certain embodiments, data storage modules 244 and data storage controller 245 are mounted on shelves in rack 242.

Circuit board 246 includes sockets 250. Each of sockets 250 may hold one of solid state data storage cards 248.

Data storage controller 245 includes processor 249 and power supply 251. Data storage controller 245 may be coupled to, and read/write on, solid state data storage cards 248. Power supply 251 may be coupled to, and supply power to electrical components on data storage controller 245 and solid state data storage cards 248. (Data and power cables between data storage controller 245 and data storage modules 244 are omitted from FIG. 5B for clarity.) Data may be striped across solid state storage cards 248, for example, in the manner described above relative to FIG. 1.

In some embodiments, a data storage module includes status indicator lights for particular solid state data storage devices. For example, in the embodiment illustrated in FIGS. 6A and 6B, each of circuit board sockets 250 may include a status indicator light that corresponds to the storage device installed in the socket. The indicator light on a socket may provide status for a solid state data storage device installed in the socket. Examples of status for a storage device may include, in various embodiments, Power On; Device Good; or Device Not Good. In certain embodiments, one indicator light provides status for two or more devices in an array. In certain embodiments, more than one indicator light is provided for a device in an array.

In some embodiments, a data storage module includes mechanisms for ejecting data storage devices. The ejection mechanisms may be operated manually, automatically, or a combination thereof. For example, in the embodiment illustrated in FIGS. 6A and 6B, sockets 250 may include a mechanism for ejecting solid state data storage cards 248.

Figure 7A:
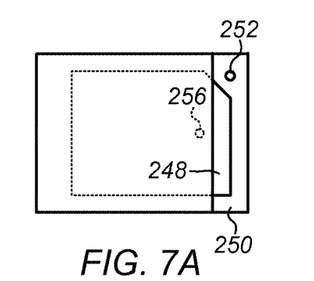
FIG. 7A illustrates one embodiment of a socket for a solid state data storage card that includes indicator light and an eject mechanism.
Figure 7B:
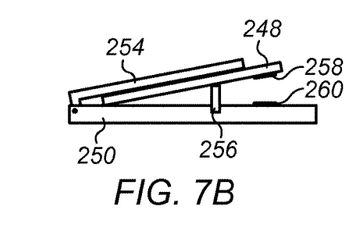
FIG. 7B illustrates a side view of a socket for a solid state data storage card in which an ejector mechanism has be operated to eject a data storage card from a fully installed position.
Figure 7C:
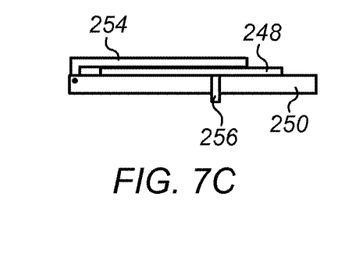
FIG. 7C illustrates a side view of a socket with a data storage card in a fully installed position.

FIG. 7A illustrates one embodiment of a socket for a solid state data storage card that includes indicator light and an eject mechanism. FIG. 7B illustrates a side view of a socket for a solid state data storage card in which an ejector mechanism has be operated to eject a data storage card from a fully installed position. FIG. 7C illustrates a side view of a socket with a data storage card in a fully installed position.

Solid state data storage card 248 is installed in socket 250. Cover 254 may hold solid state data storage card 248 in position in socket 250. Contacts 258 on state data storage card 248 may couple with corresponding contacts 260 on socket 250. Contacts may provide a connection between memory chips in solid state data storage card 248 and a data storage controller (for example, data storage controller 245 shown in FIG. 6B.)

Socket 250 includes indicator light 252. Indicator light 252 may provide status of solid state data storage card 248. Indicator light may be controlled, for example, by data storage controller 245. In one embodiment, each solid state storage device in an array has a corresponding indicator light.

Socket 250 includes ejector pin 256. Ejector pin 256 may be operated to eject solid state data storage card 248 from a fully installed position in socket 250. In some embodiments, ejector pin 256 is manually operated. In one embodiment, an ejector is operated by moving a lever or button coupled to ejector pin 256.

In some embodiments, ejector pin 256 is controlled automatically. Ejector pins 256 may be actuated, for example, by a micro actuator coupled to data storage controller 245. In one embodiment, data storage controller 245 operates ejector pin 256 to eject solid state data storage card 248 if data storage controller 245 determines that solid state data storage card 248 has failed.

In FIGS. 6A, 6B, and 7A-7C, the socket, indicator light, and ejector mechanism are dedicated to a single storage card. In other embodiments, however, a socket or tray may hold multiple storage devices, such as an entire row of storage devices. In addition, an indicator light or eject mechanism may correspond to multiple storage devices. For example, one eject mechanism may be operable to eject an entire row of data storage cards.

In some embodiments, a data storage system includes a fault detection system for identifying faults in particular data storage devices. The fault detection system may be implemented, for example, in a data storage controller for the system. In some embodiments, a fault detection system may automatically indicate a physical location of a failed data storage device. In one embodiment, the physical location of the failed device is indicated by turning on an indicator light next to the failed device. Other suitable flagging devices may include a tab, pin, or flag that pops up next to the failed device. In certain embodiments, the physical location of the failed device is indicated by automatically ejecting the device from its installed condition. For example, for the solid state data storage card shown in FIG. 7A, a fault may be indicated by automatically ejecting the card to the position shown in FIG. 7B.

Figure 8A:
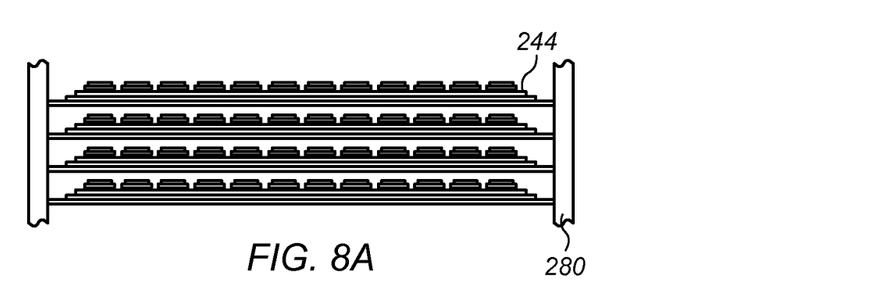
FIG. 8A illustrates an embodiment of a set of data storage modules in an installed position in a rack.
Figure 8B:
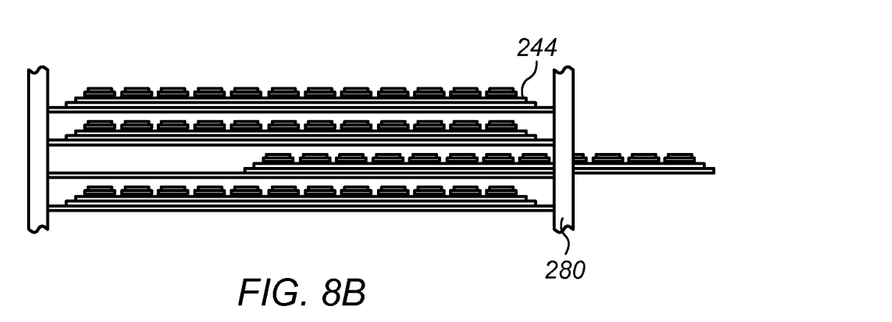
FIG. 8B illustrates an embodiment of a data storage module partially withdrawn from the rack to allow access to solid state data storage devices.

In some embodiments, data storage modules allow removal and replacement of solid state data storage devices while the data storage module remains partially installed in the rack. FIG. 8A illustrates an embodiment of a set of data storage modules in an installed position in a rack. FIG. 8B illustrates an embodiment of a data storage module partially withdrawn from the rack to allow access to solid state data storage devices. In FIG. 8A, all four of data storage modules 244 are fully installed in rack 280. In FIG. 8B, one of data storage modules 244 is partially withdrawn from rack 280. The partially withdrawn data storage module may be maintained in a horizontal position, for example, on slides coupled to rack 280. With the data storage module partially withdrawn, solid state data storage devices 244 may be removed and replaced.

Figure 9A:
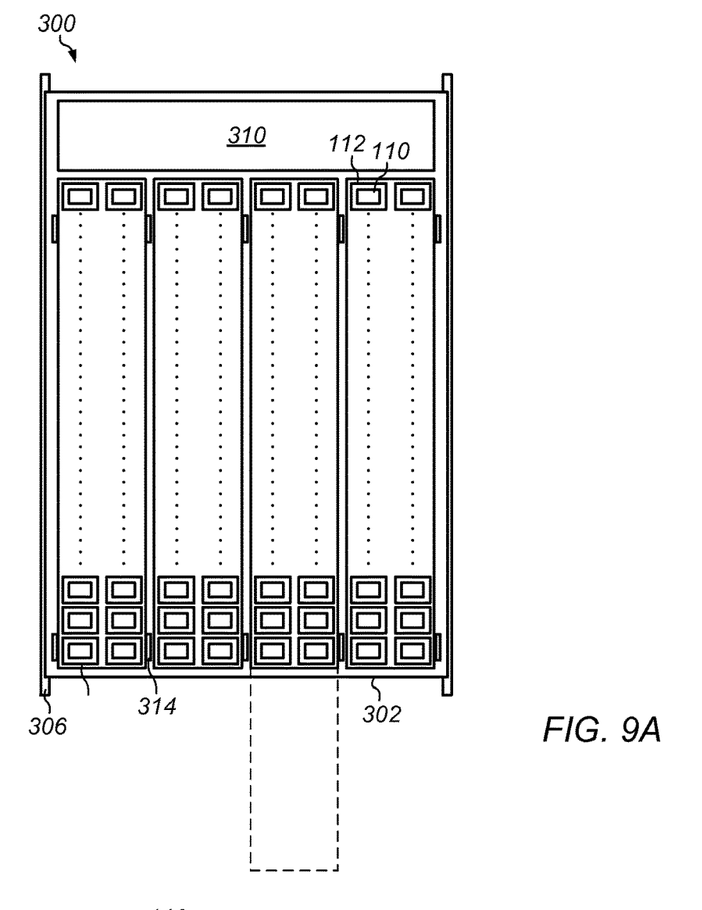
FIG. 9A is a top view illustrating one embodiment of a data storage module in which circuit boards are mounted in a co-planar arrangement.
Figure 9B:
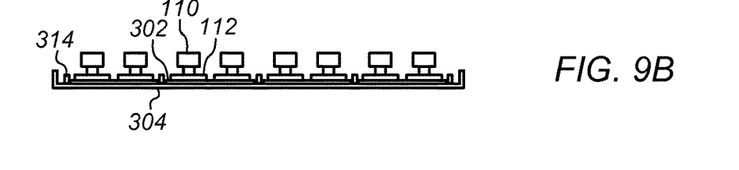
FIG. 9B is a side view illustrating one embodiment of a data storage module in which circuit boards are mounted in a co-planar arrangement.

In some embodiments, a rack data storage module includes two or more circuit boards holding solid state data storage devices in a sectional arrangement. FIG. 9A is a top view illustrating one embodiment of a data storage module in which circuit boards are mounted in a co-planar arrangement. FIG. 9B is a side view illustrating one embodiment of a data storage module in which circuit boards are mounted in a co-planar arrangement. System 300 includes tray 302 and circuit boards 304. Circuit boards 304 are installed along side one another in slots formed between guides 314 on tray 314. Each of circuit boards 304 carries solid state data storage devices 110 in sockets 112. Controller 310 may be coupled to each of circuit boards 304. Data may be striped across solid state storage cards 112, for example, in the manner described above relative to FIG. 1.

Data storage module 300 may be rack-mounted. In one embodiment, tray 304 is mounted in a rack on rails 306. Each of circuit boards 304 may be separately removable from data storage module 300. For example, each of circuit boards 304 may slide out on tray 302 between adjacent guides 314 on tray 302 (for example, to the position indicated by the phantom lines in FIG. 8A.)

Figure 10:
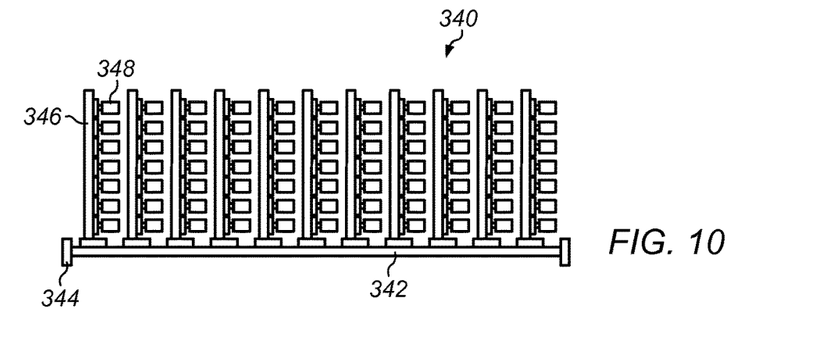
FIG. 10 illustrates one embodiment of a data storage module including a vertical carrier board on a motherboard assembly.

FIG. 10 illustrates one embodiment of a data storage module including a vertical carrier board on a motherboard assembly. Data storage module 340 includes motherboard assembly 342 on rails 344. Motherboard assembly 342 may be mounted on rails in a rack. Carrier boards 346 are mounted in a vertical orientation on motherboard assembly 342. Carrier boards 224 include an array of solid state data storage devices 348. Each array may include solid state data storage devices arranged in row and columns, similar to that described above relative to FIG. 1A.

In certain embodiments, each of a carrier boards in a data storage module can be separately slid out from its installed position in a rack. For example, carrier boards may be slide in and out of a rack on a tray.

Figure 11:
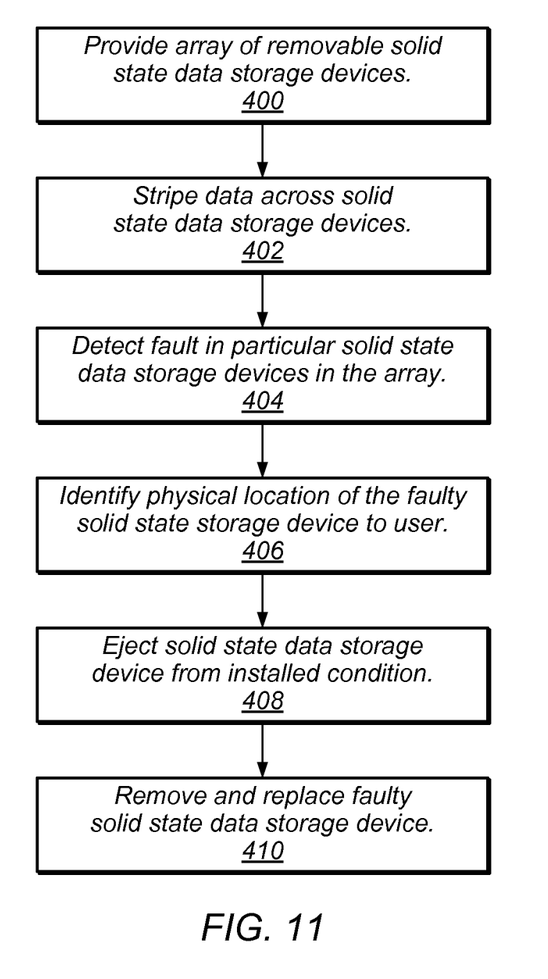
FIG. 11 illustrates providing data storage with an array of solid state storage devices on circuit board assemblies.

FIG. 11 illustrates providing data storage with an array of solid state storage devices on circuit board assemblies. At 400, an array of removable solid state data storage devices is provided on one or more circuit board assemblies. In one embodiment, the data storage devices are off-the-shelf solid state storage devices, such as a USB thumb drive. In some embodiments, the array is mounted in a rack. At 402, data is striped data across the solid state data storage devices in the array.

At 404, a fault is automatically detected in a particular one of the removable solid state data storage devices in the array. A fault may include any condition that prevents effective reading or writing on a data storage device. A fault may exist, for example, where a portion of a solid state storage device has become corrupted or damaged. In some embodiments, error detection is carried out using dedicated parity information. The parity information may be stored in a separate storage device. In some embodiments, corrupted data is restored using stored parity information At 406, the physical location of the faulty solid state storage device is identified to a user. In some embodiments, the indication is provided by an indicator light in proximity with the faulty device.

At 408, the faulty device is ejected from its installed condition in the data storage module. In some embodiments, the faulty solid state data storage device is manually ejected. In other embodiments, the faulty solid state storage device is automatically ejected.

At 410, the faulty solid state data storage device is removed and replaced. In some embodiments, a data storage controller perform operations to preserve, recover, or repair information on a solid state data storage device.

In certain embodiments, some of the devices in array of solid state data storage devices remain in a powered down state or placed on standby. When the devices power powered down or placed on standby, power consumption of the data storage module may be reduced. A solid state data storage device may be placed on standby or powered down, for example, when immediate access to data stored on the device is not needed (for example, archival storage). The powered down or standby mass storage devices may be considered to be in a cold storage state.

In some embodiments, data storage modules with solid state storage devices are used in combination with other types of data storage devices, such as magnetic hard disk drives or optical disk drives. In certain embodiments, an memory in an array of solid state data storage devices is used as cache for data stored on other solid state memory or on other types of data storage devices.

In various embodiments, a data storage unit includes a power supply that conforms to an industry-recognized standard. In some embodiments, a power supply for a computing unit has a form factor in accordance with an industry-recognized standard. In one embodiment, a power supply unit has a standard 1 U form factor. Examples of other standards for a power supply and/or a power supply form factor include 2 U, 3 U, SFX, ATX, NLX, LPX, or WTX.

In certain embodiments, a data storage module or data control module may have one or more internal fans to promote the flow of air through a data storage module. For example, in certain embodiments, a row of fans may be provided on data storage module 244 shown in FIG. 6A.

Although in many of the embodiments described herein solid state data storage modules and controllers are shown a rack, a data storage modules may, in various embodiments, be placed in any suitable location.

Although in various embodiments described above, carrier circuit boards for solid state data storage devices are installed in a horizontal orientation, carrier circuit boards for solid state data storage devices may be installed in any orientation. For example, in one embodiment, solid state data storage devices extend horizontally from a circuit board mounted in a vertical orientation.

In various embodiments herein, the data storage controller for solid state data storage devices has been illustrated as a separate circuit board, or as a dedicated region of a circuit board. A controller for solid state data storage devices may, however, be provided in any location. In some embodiments, components for a data storage controller for solid state data storage devices are distributed over a carrier circuit board for the devices. In one embodiment, a data storage controller is located on a carrier circuit board on the opposite side from the data storage devices (for example, on the bottom of circuit board 246 shown in FIGS. 6A and 6B.

Drawings herein may or may not be to scale. For example, in FIGS. 1B, 2B, 6B, 8A, 8B, and 9B, the height and spacing of storage devices, circuit boards and various other elements may be exaggerated relative to width of these elements for the sake of clarity. In various embodiments, thin trays of cards are mounted in a rack in a compact stack. In one embodiment, about 10 trays of SD cards are stacked in a 1 U slot.

In some embodiments, rack-mounted data storage modules are commonly cooled by a cooling air system that delivers air to the rack. To remove heat from data storage modules installed in the rack, an air handling system may be operated to cause air to flow in computer room and through the rack system. As the air reaches the front of each of data storage modules, the air may pass through the chassis of the computing modules. After passing through the chassis, the heated air may exit the rear of the rack system and flow out of the computer room. In certain embodiments, data storage modules may have on board fans in addition to, or lieu of, a central cooling system. In certain embodiments, a rack may have a fan that supplies cooling air to all of the computing modules in the rack.

In certain embodiments, solid state data storage modules are mounted downstream computing devices in rack (for example, with the data storage modules at the rear of a rack that has front-to-back cooling air flow.) In one embodiment, a network attached storage system includes striped solid state data storage devices.

In some embodiments, a rack system includes rack-mounted fans external to data storage modules in the rack. The rack-mounted fans may provide air flow through the data storage modules.

For clarity, data storage modules in some of the figures herein have been shown with a simple box outline around functional components. In various embodiments, a module or a chassis for a module may include an enclosure, a tray, a mounting plate, a combination thereof, as well as various other structural elements.

Although in the embodiments described above, some of the data storage modules have been described as being 1 U or less in height, modules may in various embodiments be 3 U, 4 U, 6 U or any other height or dimensions.

In various embodiments herein, all of the storage devices in a module are described as being solid state devices. In various embodiments, however, solid state data storage device may be combined on a module with other types of storage, such as magnetic hard disk drives or optical disk drives.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data storage module, comprising:
a chassis enclosing and supporting a plurality of carrier circuit board assemblies, wherein the chassis comprises:
exterior slides configured to couple with rails mounted on vertical posts of a rack, wherein the exterior slides are configured to enable the chassis to be pulled out from, and pushed into, an installed position in the rack;
one or more trays; and
guides mounted on the one or more trays that are configured to engage with the carrier circuit boards assemblies; and
a plurality of groups of removable solid state data storage devices wherein each group comprises a separate plurality of sets of removable solid state data storage devices, and wherein respective groups of removable solid state data storage devices are coupled to respective separate carrier circuit board assemblies of the plurality of carrier circuit board assemblies, wherein the plurality of carrier circuit board assemblies with respective groups of coupled removable solid state data storage devices are vertically arranged in a plurality of tiers, one above another, in the chassis;
a power supply mounted in the chassis that is coupled to, and configurable to supply power to, each of the plurality of groups of removable solid state data storage devices coupled to the plurality of carrier circuit board assemblies included in the chassis;
a data storage controller mounted in the chassis that is coupled to each of the plurality of groups of removable solid state data storage devices coupled to the plurality of carrier circuit board assemblies included in the chassis, wherein the data storage controller is configured to stripe data across at least two separate sets of the removable solid state data storage devices in at least two tiers of the plurality of tiers; and
a fault detection system configured to detect a fault in at least one particular removable solid state storage device of the removable solid state data storage devices, wherein the fault detection system comprises:
ejection mechanisms configured to automatically eject individual ones of removable solid state data storage devices in response to the fault detection system detecting a fault in at least one particular removable solid state storage device, wherein to automatically eject the at least one particular removable solid state storage device the at least one ejection mechanism is configured to push at least a portion of the at least one particular removable solid state storage device away from an upper surface of the at least one carrier circuit board assembly; and
wherein each carrier circuit board assembly of the plurality of carrier circuit board assemblies is configured to at least partially slide in and out of the chassis on a respective one of the one or more trays, independently of a remainder of the plurality of carrier circuit board assemblies, via the guides mounted on the one or more trays such that the removable solid state data storage devices on the respective carrier circuit board assembly of a particular tier of solid state storage devices can be removed from the chassis without at least partially withdrawing the remainder of the carrier circuit board assemblies from the chassis comprising the remaining tiers of solid state storage devices.

2. The data storage module of claim 1, wherein at least one of the removable solid state data storage devices comprises a case, wherein the case encloses a circuitry of the removable solid state data storage device except for electrical contacts for connecting the removable solid state data storage device with the data storage controller.

3. The data storage module of claim 1, wherein at least one of the removable solid state data storage devices is a commodity device.

4. The data storage module of claim 1, wherein at least one tier of the plurality of tiers comprises removable solid state data storage devices arranged in an arrangement that is at least two by two, such that the tier comprises at least two sets of removable solid state data storage devices and each set comprises at least two removable solid state data storage devices.

5. A data storage system, comprising:
a tray comprising a plurality of parallel interior guides which establish a plurality of co-planar slots extending in parallel between opposite ends of the tray;
wherein the opposite ends of the tray are configured to couple the tray to a rack via rails, wherein the rails are configured to enable the tray to be pulled out from, and pushed into, an installed position in the rack;

a plurality of circuit board assemblies mounted in a co-planar arrangement in the plurality of slots established on the tray, such that each circuit board assembly is mounted in a separate slot;

a plurality of arrays of two or more removable solid state data storage devices wherein each array is separately coupled to a separate one of the plurality of circuit board assemblies;

one or more data storage controllers coupled to at least two of the removable solid state data storage devices in at least two of the plurality of arrays of two or more removable solid state data storage devices, wherein the data storage controller is configured to stripe data across at least two of the arrays of removable solid state data storage devices; and a fault detection system configured to detect a fault in at least one particular removable solid state storage device of the removable solid state data storage devices, wherein the fault detection system comprises:

ejection mechanisms configured to automatically eject individual ones of the removable solid state data storage devices in response to the fault detection system detecting a fault in at least one particular removable solid state storage device, wherein to automatically eject the at least one particular removable solid state storage device the at least one ejection mechanism is configured to push at least a portion of the at least one particular removable solid state storage device away from an upper surface of the at least one circuit board assembly, wherein the tray is configured to at least partially slide in and out of the rack independently of other trays mounted in the rack via the rails; and wherein each circuit board assembly of the plurality of circuit board assemblies mounted in a co-planar arrangement in the plurality of slots established on the tray is configured to at least partially slide in and out of the tray, independently of a remainder of the plurality of circuit board assemblies, via the interior guides coupled to the tray such that the removable solid state data storage devices on the respective circuit board assembly can be removed from the tray without at least partially withdrawing the remainder of circuit board assemblies from the tray.

6. The data storage system of claim 5, wherein at least one of the removable solid state data storage devices comprises a case, wherein the case encloses a circuitry of the removable solid state data storage device except for electrical contacts for connecting the removable solid state data storage device with the data storage controller.

7. The data storage system of claim 5, wherein the tray, the plurality of circuit board assemblies, and the plurality of arrays of two or more removable solid state data storage devices are included in a data storage module,
wherein the data storage system comprises a set of data storage modules comprising the data storage module and one or more additional data storage modules.

8. The data storage system of claim 7, wherein at least one data storage module of the set of data storage modules is stacked above at least one other data storage module of the set of data storage modules.

9. The data storage system of claim 8, wherein at least one data storage module of the set of data storage modules is rack-mounted on the rails, wherein the at least one data storage module is configured to slide in and out of the rack on the rails so that the removable solid state data storage devices can be removed from the circuit board assembly when the circuit board assembly is at least partially withdrawn from a fully installed position in the rack.

10. The data storage system of claim 5, wherein at least one of the data storage devices in the array is mounted at a slant relative to the circuit board assembly.

11. The data storage system of claim 5, wherein at least one of the removable solid state data storage devices in the array is installed horizontally on the board.

12. The data storage system of claim 5, wherein at least one of the circuit board assemblies comprises one or more status lights, wherein each of at least one of the status lights provides a status indicator for at least one of the removable solid state data storage devices.

13. The data storage system of claim 5, wherein the at least one ejection mechanism is further configured to rotatably eject the at least one particular removable solid state data storage device from an installed position to an angled ejected position, based at least in part on the ejection mechanism pushing an end of the at least one of the removable solid state data storage devices away from an upper surface of the at least one circuit board assembly.

14. The data storage system of claim 5, wherein the data controller is on at least one of the circuit board assemblies to which at least some of the removable solid state data storage devices are coupled.

15. The data storage system of claim 5, wherein at least one of the one or more circuit board assemblies are installed in a rack in a primarily vertical orientation.

16. A method of providing data storage, comprising:
providing, in a rack, a plurality of trays, wherein each tray comprises a plurality of parallel interior guides which establish a plurality of co-planar slots extending in parallel between opposite ends of the tray, wherein each tray is mounted in the rack via rails mounted to vertical posts of the rack, wherein the rails are configured to enable respective trays to be pulled out from, and pushed into, an installed position in the rack,
wherein each tray supports:
a plurality of circuit board assemblies mounted in a co-planar arrangement in the plurality of co-planar slots established on the tray, such that each circuit board assembly is mounted in a separate slot;
a plurality of groups of removable solid state data storage devices wherein each group comprises at least two sets of removable solid state data storage devices separately coupled to a separate one of the plurality of circuit board assemblies,
a power supply coupled to, and configurable to supply power to, each group of removable solid state data storage devices on each of the plurality of circuit board assemblies supported by the tray; and
wherein the plurality of trays support sets of the circuit board assemblies, and wherein the plurality of trays are vertically arranged in a plurality of tiers, one above another, and
wherein a data storage controller coupled to each group of two or more groups of removable solid state data storage devices supported by two or more of the vertically arranged trays is configured to stripe data across at least two sets of the removable solid state data storage devices in different ones of the plurality of tiers;
striping data across the at least two sets of the removable solid state data storage devices;
automatically detecting a fault in a particular one of the removable solid state data storage devices; and in response to detecting the fault, automatically at least partially ejecting the particular one of the of the removable solid state data storage devices, wherein automatically at least partially ejecting the particular removable solid state data storage device comprises an ejector mechanism of a respective one of the circuit board assemblies pushing at least a portion of the particular removable solid state data storage device away from the respective one of the circuit board assemblies, wherein the respective trays are configured to at least partially slide in and out of the rack independently of other trays mounted in the rack via the rails;

wherein each circuit board assembly of the plurality of circuit board assemblies mounted in a co-planar arrangement in the plurality of slots established on the tray is configured to at least partially slide in and out of the tray, independently of a remainder of the plurality of circuit board assemblies, via the interior guides coupled to the respective tray such that the removable solid state data storage devices on the respective circuit board assembly can be removed from the tray without at least partially withdrawing the remainder of circuit board assemblies from the tray.

17. The method of claim 16, wherein automatically at least partially ejecting the particular one of the removable solid state data storage devices further comprises rotatably ejecting the particular one of the removable solid state data storage devices from an installed position to an angled ejected position.

18. The method of claim 17, further comprising automatically indicating to a user the physical location of the particular one of the removable solid state data storage devices that has a fault.

19. The method of claim 17, further comprising removing and replacing the particular one of the removable solid state data storage devices that has a fault.

20. The method of claim 16, further comprising selectively powering a portion of the removable solid state data storage devices.

21. The method of claim 16, wherein the plurality of groups of removable solid state data storage devices are installed in a rack downstream from at least one heat producing component in the rack.

22. A data storage system, comprising:
two or more sets of data storage devices, wherein each data storage device comprises a contact proximate to a particular end of the respective data storage device;
at least one carrier configured to support at least one set of the two or more data storage devices, the at least one carrier comprising at least one ejection mechanism for at least one of the data storage devices and a cover configured to hold at least one of the data storage devices in one or more particular positions in the carrier;
a data storage controller configured to be coupled to each data storage device coupled to the at least one carrier; and
a chassis enclosing and supporting at least the data storage controller and the at least one carrier upon which the two or more sets of data storage devices are supported;
a fault detection system configured to detect a fault in at least one of the data storage devices,
wherein the fault detection system is configured to at least partially eject the at least one data storage device from an installed position after a fault condition is detected in the at least one data storage device,
wherein, to at least partially eject the at least one data storage device from the installed position, the carrier is configured to rotatably eject the at least one data storage device away from the installed position to an angled ejected position, based at least in part upon the ejection mechanism pushing the particular end of the at least one data storage device, and a corresponding end of the cover, upwards from an upper surface of the carrier while an opposite end of the cover holds down a corresponding opposite end of the at least one data storage device in physical contact with the upper surface of the carrier, such that the at least one data storage device is held in a position where the contact at the particular end of the at least one data storage device is electrically decoupled from a corresponding contact on the upper surface of the carrier and the at least one data storage device is electrically decoupled from the data storage controller via the corresponding contact;
wherein the carrier is configured to indicate a physical location of the at least one data storage device after a fault is detected in the at least one data storage device.

23. The data storage system of claim 22, wherein the carrier comprises at least one light associated with at least one of the data storage devices, wherein the fault detection system is configured to automatically turn on the light after a fault condition is detected in the at least one data storage device.

24. The data storage system of claim 22, wherein the carrier comprises at least one flagging device associated with at least one of the data storage devices, wherein the fault detection system is configured to automatically trigger the at least one flagging device after a fault condition is detected in the at least one data storage device to indicate a fault in the at least one data storage device.

* * * * *